US010804791B2

(12) United States Patent
Mondzik et al.

(10) Patent No.: US 10,804,791 B2
(45) Date of Patent: Oct. 13, 2020

(54) DRIVER CIRCUIT, CIRCUIT ARRANGEMENT COMPRISING A DRIVER CIRCUIT, AND INVERTER COMPRISING A CIRCUIT ARRANGEMENT

(71) Applicant: SMA SOLAR TECHNOLOGY AG, Nielstetal (DE)

(72) Inventors: Andrzej Mondzik, Skarzysko Koscielne (PL); Adam Penczek, Cracow (PL); Marek Rylko, Bielsko-Biala (PL); Slawomir Szot, Krosno (PL); Milosz Szarek, Cracow (PL); Robert Stala, Cracow (PL)

(73) Assignee: SMA SOLAR TECHNOLOGY AG, Niestetal (DE)

( * ) Notice: Subject to any disclaimer, the term of this patent is extended or adjusted under 35 U.S.C. 154(b) by 0 days.

(21) Appl. No.: 15/724,447

(22) Filed: Oct. 4, 2017

(65) Prior Publication Data
US 2018/0026517 A1  Jan. 25, 2018

Related U.S. Application Data

(63) Continuation of application No. PCT/EP2016/056972, filed on Mar. 30, 2016.

(30) Foreign Application Priority Data

Apr. 4, 2015  (DE) .................. 10 2015 105 192

(51) Int. Cl.
*H02M 1/08* (2006.01)
*H03K 17/082* (2006.01)
*H03K 17/18* (2006.01)

(52) U.S. Cl.
CPC ........ *H02M 1/082* (2013.01); *H03K 17/0828* (2013.01); *H03K 17/18* (2013.01); *H03K 2217/0027* (2013.01)

(58) Field of Classification Search
CPC .......... H02M 1/082; H02M 1/08; H02M 1/32; H02M 2001/0029; H02M 3/335;
(Continued)

(56) References Cited

U.S. PATENT DOCUMENTS

| 4,924,109 A | * | 5/1990 | Weber | .................. H05B 39/085 |
|---|---|---|---|---|
| | | | | 307/126 |
| 5,134,320 A | * | 7/1992 | Perusse | .................. H02M 1/34 |
| | | | | 327/382 |

(Continued)

FOREIGN PATENT DOCUMENTS

WO      2013/145854 A1    10/2013

OTHER PUBLICATIONS

International Search Report dated Jun. 8, 2016 for International Application PCT/EP2016/056972.
(Continued)

*Primary Examiner* — Shawki S Ismail
*Assistant Examiner* — Demetries A Gibson
(74) *Attorney, Agent, or Firm* — Eschweiler & Potashnik, LLC (57) ABSTRACT

The disclosure discloses a driver circuit that is intended for a power semiconductor switch having a unidirectional flow direction and having a control connection, a reference potential connection and a controlled connection. The driver circuit includes a driver module having a control output, a reference potential input and an overvoltage monitoring input. In this case, the control output is connected to a first connection that is provided for connection to the control connection, the reference potential input is connected to a second connection that is provided for connection to the reference potential connection, and the overvoltage monitoring input is connected, via a first diode, to a third connection that is provided for connection to the controlled
(Continued)

connection. The overvoltage monitoring input is also connected to the reference potential input via a capacitance. A connection path from the second connection to the third connection via the capacitance and the first diode is switchable in the driver circuit by means of an actively controllable switching element. Furthermore, the disclosure also discloses a circuit arrangement comprising such a driver circuit and a power semiconductor switch with a unidirectional flow direction as well as a bidirectional circuit arrangement comprising two subcircuit arrangements that are each formed by such a circuit arrangement. Such a bidirectional circuit arrangement is used in an inverter having a BSNPC bridge circuit.

18 Claims, 4 Drawing Sheets (58) Field of Classification Search
CPC .............. H02M 3/33523; H02M 7/537; H03K 17/0828; H03K 17/08128; H03K 17/18; H03K 17/567; H03K 2217/0027; H03K 2217/0036; H03K 3/012; G05F 1/571; H01L 2924/13055

See application file for complete search history.

(56) References Cited

U.S. PATENT DOCUMENTS

| | | | | |
|---|---|---|---|---|
| 7,940,503 B2* | 5/2011 | Volke | ................ | H03K 17/0822 361/56 |
| 2009/0153223 A1 | 6/2009 | Bayerer | | |
| 2010/0006563 A1* | 1/2010 | Schilling | ................ | H05B 6/062 219/661 |
| 2010/0066175 A1* | 3/2010 | Jansen | .................... | H02M 1/08 307/89 |
| 2011/0049667 A1* | 3/2011 | Werner | ............... | H01L 27/0676 257/503 |
| 2012/0056921 A1* | 3/2012 | Nakano | ................ | B41J 2/17513 347/1 |
| 2013/0033909 A1* | 2/2013 | Jones | ................ | H03K 17/0812 363/56.01 |
| 2013/0277362 A1* | 10/2013 | Ribarich | ............... | H05B 6/062 219/620 |
| 2013/0308357 A1* | 11/2013 | Amano | ................... | H02M 7/48 363/71 |
| 2014/0091643 A1 | 4/2014 | Norling | | |
| 2014/0203843 A1* | 7/2014 | Cottell | ................... | H03K 17/78 327/81 |
| 2014/0320178 A1* | 10/2014 | Hosini | ............ | H03K 17/08128 327/109 |
| 2014/0362485 A1* | 12/2014 | Smith | ...................... | H02H 9/04 361/86 |
| 2015/0180368 A1* | 6/2015 | Wang | .................... | H02M 5/293 363/80 |
| 2015/0207418 A1* | 7/2015 | Eum | ................ | H02M 3/33523 363/21.12 |
| 2016/0072276 A1* | 3/2016 | Zhang | ................... | H02M 7/066 361/18 |
| 2016/0282407 A1* | 9/2016 | Bacigalupo | ........ | G01R 31/2621 |

OTHER PUBLICATIONS

"Single IGBT Gate Driver." MC33153, ON Semiconductor. Semiconductor Components Industries, LLC. Aug. 2013—Rev. 8. 14 pages.

* cited by examiner

DRIVER CIRCUIT, CIRCUIT ARRANGEMENT COMPRISING A DRIVER CIRCUIT, AND INVERTER COMPRISING A CIRCUIT ARRANGEMENT

CROSS-REFERENCE TO RELATED APPLICATIONS

This application claims priority to PCT Patent Application Number PCT/EP2016/056972, filed on Mar. 30, 2016, which claims priority to German Patent Application Number DE 10 2015 105 192.3, filed on Apr. 4, 2015, which are hereby incorporated by reference in their entirety.

FIELD

The disclosure relates to a driver circuit for a power semiconductor switch with unidirectional flow direction, as well as a circuit arrangement comprising such a driver circuit and a power semiconductor switch with unidirectional flow direction. Furthermore, the disclosure relates to a bidirectional circuit arrangement comprising two such circuit arrangements, as well as an inverter with a BSNPC bridge circuit comprising a corresponding bidirectional circuit arrangement.

BACKGROUND

For the generation of drive signals for a power semiconductor switch, digital circuits, in particular microprocessors, for example, are frequently used. However, the output currents provided by digital circuits are in many cases not sufficient to directly drive a power semiconductor switch. Therefore, driver circuits are used between the digital circuit and the power semiconductor switch, which provide a current at the required level.

So-called driver modules are available in which the essential components of a driver circuit for many applications are already integrated. A driver circuit for a specific application can be realized with such a driver module by adding and appropriately dimensioning discrete components, such as resistors, diodes and capacitances, in a manner known to a person skilled in the art, for example from data sheets or application notes of the manufacturers of driver modules.

Many driver modules provide additional functions beyond the actual driver function, which protect the power semiconductor switch or the driver module from destruction due to excessive voltages or currents in certain unintended operating situations. Very common are, for example, driver modules with an overvoltage monitoring input for the so-called "desaturation monitoring" (DESAT), whereby the power semiconductor switch is opened via a corresponding control by the driver module in the case of an excessively high voltage between a controlled terminal and a reference potential terminal of the closed power semiconductor switch.

From the data sheet "MC33153 Single IGBT Gate Driver", August, 2013—Rev. 8, MC33153/D of Semiconductor Components Industries, LLC, for example, a driver module is known that has an overvoltage monitoring input for "desaturation monitoring" (DESAT). In this case, the DESAT input is connected via an optional resistor and a diode to the controlled terminal of a power semiconductor switch, with a capacitance further being arranged between the DESAT input and the reference potential terminal of the power semiconductor switch. Furthermore, various possibilities for connecting a control output of the driver module to a control terminal of the power semiconductor switch are also known from the data sheet.

Application Note 5324, entitled "Desaturation Fault Detection", AV02-0258EN—Jun. 1, 2007 by Avago Technologies Limited discloses the same wiring of a DESAT input as the aforementioned data sheet of Semiconductor Components Industries, LLC, for various driver modules.

The same form of the wiring of a DESAT input is also used in the driver module in the application note AN1944 "Developing IGBT applications using TD350 advanced IGBT driver", Rev. 4, 9 Oct. 2006 by STMicroelectronics. The driver module shown here further has respective separate control outputs for switching on and off a power semiconductor switch.

Document US 2009/0153223 A1 discloses a driver circuit for an IGBT comprising a control terminal, a reference potential terminal, and a controlled terminal. The driver circuit comprises a desaturation circuit consisting of a series connection of a switch, a voltage source and a diode, wherein the desaturation circuit is connected between the controlled terminal of the IGBT and a terminal of a gate resistor facing the control terminal of the IGBT. In embodiments of the driver circuit, the voltage source is formed by a capacitor being charged when the IGBT is switched off. The switch is closed prior to switching off of the IGBT, wherein the IGBT is subsequently switched off at a predetermined time delay after closing of the switch. A capacitance being regularly provided in driver circuits with desaturation monitoring between a point connecting the voltage source with the diode and the reference potential present at the reference potential terminal is not provided in US 2009/0153223 A1.

Power semiconductor switches often have an antiparallel diode either in the form of an intrinsic diode, for example a body diode, or a diode additionally connected inside or outside a power semiconductor module. If no such antiparallel diode is present, that is to say in the case of a power semiconductor switch with unidirectional flow direction, for example in so-called reverse blocking IGBTs, the potential at the reference potential terminal of the power semiconductor switch can be higher than the potential at the controlled terminal, so that in a conventional circuitry, such as described in the previously mentioned data sheets or application notes, an undesired current flows from the reference potential terminal to the controlled terminal, which can lead to a destruction of components of the driver circuit.

Reverse Blocking IGBTs are for example used in the neutral branch of a BSNPC (Bipolar Switched Neutral Point Clamped) inverter, also known as NPC-2 inverter, in particular as a bidirectional circuit arrangement of two Reverse Blocking IGBTs in antiparallel connection. Such a BSNPC inverter with a bidirectional switch formed from antiparallelly connected Reverse Blocking IGBTs is, for example, disclosed in document WO 2013/145854 A1. A driver circuit is present for each of the IGBTs, wherein for none of the driver circuits measures for monitoring desaturation are provided.

In the document "Application of Gate Drivers for 3-Level NPC-2 Power Modules with Reverse Blocking IGBTs", PCIM ASIA, Shanghai, China, 17-19 Jun. 2014, by C. Dustert and A. Volke it is proposed in the case of using Reverse Blocking IGBTs in the neutral branch of an NPC-2 inverter to provide a resistor chain instead of the diode in the circuitry of the DESAT input, which on the one hand still ensures the DESAT monitoring functionality, but on the other hand dangerously high currents can no longer flow.

The disadvantage is that an undesired current still flows from the reference potential terminal to the controlled terminal when the potential at the reference potential terminal of the power semiconductor switch is higher than at the controlled terminal, which at least leads to undesired power losses.

SUMMARY

It is therefore an object of the present disclosure to provide a driver circuit in which the occurrence of undesired currents is reliably prevented when an overvoltage monitoring input of a driver module is wired for the realization of a desaturation monitoring, without having to accept unintended power losses.

A driver circuit according to the disclosure for a power semiconductor switch with unidirectional flow direction, i.e. for a power semiconductor switch for which a current flow opposite to the flow direction is blocked, comprises a driver module that has a control output, a reference potential input and an overvoltage monitoring input. The control output is connected to a first terminal of the driver circuit that is provided for connection to a control terminal of the power semiconductor switch. The reference potential input is connected to a second terminal that is provided for connection to a reference potential terminal of the power semiconductor switch, and the overvoltage monitoring input is connected via a first diode to a third terminal that is provided for connection to a controlled terminal of the power semiconductor switch. Furthermore, in the driver circuit according to the disclosure, the overvoltage monitoring input is connected to the reference potential input via a capacitance.

In this wiring of the driver module with the first, second and third terminal, a connection path exists from the second terminal to the third terminal via the capacitance and the first diode. In the driver circuit according to the disclosure, the connection path can be switched by an actively controllable switching element. This solution is based on the overcoming of the prejudice that for monitoring the voltage between the controlled terminal of the power semiconductor switch and the reference potential terminal of the power semiconductor switch, on the one hand the overvoltage monitoring input must be connected permanently to the controlled terminal via a diode or alternatively via a resistor chain and, thus, must also be connected permanently to the third terminal of the driver circuit via the diode or alternatively via the resistor chain, and, on the other hand, the reference potential input must be connected permanently to the reference potential terminal and thus also to the second terminal of the driver circuit. However, overvoltage monitoring of a power semiconductor switch connected to the driver circuit, and thus the aforementioned connections, are rather required only when the power semiconductor switch is switched on, while undesired currents can flow in the connection path only when the power semiconductor switch is switched off.

The driver module of the driver circuit according to the disclosure is configured to apply a reference potential present at the reference potential input or a control potential present at a control potential input of the driver module to the control output. The control output, to which the two different potentials are applied, can be one and the same control output. However, two control outputs may also be present, the control potential then being applied to the first control output while the second control output is in a high-resistance state, and the reference potential being applied to the second control output while the first control output is in a high-resistance state.

Also preferably, the driver module is configured to detect an exceedance of a threshold value, set within the driver module, by a voltage at the overvoltage monitoring input against the reference potential. In context with the connection of the overvoltage monitoring input to the third terminal via the first diode a desaturation monitoring can then be carried out, for example, by applying at the overvoltage monitoring input a voltage against the reference potential that is larger than the threshold value, for example by a separate current source or preferably directly by the driver module. As long as the voltage between the controlled terminal and the reference potential terminal of a power semiconductor switch connected to the third terminal and the second terminal of the driver circuit does not reach dangerously high values, the voltage at the overvoltage monitoring input against the reference voltage potential is clamped to zero, or more precisely to the forward voltage of the power semiconductor switch, by the first diode.

In an embodiment of the driver circuit according to the disclosure, the overvoltage monitoring input can also be connected to the third terminal via a series connection of a first resistor and the first diode instead of a connection via the first diode only. The first resistor limits the current flow when transient voltage spikes occur during switching operations of the power semiconductor switch, and thus serves to protect the driver module.

Optionally, in another embodiment a second diode may be arranged between the reference potential input and the overvoltage monitoring input in the driver circuit, and a third diode may be arranged between the overvoltage monitoring input and the control potential input. Such an arrangement of two diodes serves as a protective circuit for the overvoltage monitoring input. This results in a further connection path from the second terminal to the third terminal via the second diode, the first resistor, if present, and the first diode. Since the second diode is arranged directly in parallel to the capacitance, the further connection path is also switchable by the actively controllable switching element in the driver circuit according to the disclosure.

An undesired current flow can occur via the connection path, or else via the further connection path, if the potential at the second terminal is higher than the potential at the third terminal. Therefore, in one embodiment of the driver circuit according to the disclosure, a control device is provided that is adapted to open the switching element when the potential at the second terminal is higher than the potential at the third terminal.

As already mentioned, monitoring the voltage between the controlled terminal and the reference potential terminal of a power semiconductor switch connected to the driver circuit is required only while the power semiconductor switch is in a turned on state. Therefore, in a further embodiment of the driver circuit, the control device is, as an alternative or in addition, configured to close the switching element when the control potential is applied to the control output.

In a reverse conclusion, monitoring the voltage between the controlled terminal and the reference potential terminal of a power semiconductor switch connected to the driver circuit is not required while the power semiconductor switch is in a turned off state. For a further embodiment of the driver circuit, this results in the control device being configured to open the switching element when the reference potential is applied to the control output.

The switching element may be arranged in a part of the connection path between the capacitance and the third terminal. However, the switching element can also be arranged in a part of the connection path between the second terminal and the capacitance. In this case, it is necessary that a fifth diode is arranged in parallel to the switching element so that a current can also flow from the control terminal of the power semiconductor switch via the driver module to the reference potential terminal of the power semiconductor switch even when the switching element is switched off. In principle, the use of more than one switching element is not excluded, wherein the switching elements then may each also be arranged in different parts of the connection path.

In one embodiment of the driver circuit according to the disclosure, the switching element is a semiconductor switch comprising a control input, resulting in a further embodiment in which the control input is connected to the control output of the driver module.

A circuit arrangement according to the disclosure comprises, in addition to the driver circuit already described, a power semiconductor switch with unidirectional flow direction, the first terminal being connected to the control terminal, the second terminal being connected to the reference potential terminal, and the third terminal being connected to the controlled terminal of the power semiconductor switch. The power semiconductor switch can be, for example, an IGBT without antiparallel diode. Such IGBTs are also known as so-called Reverse Blocking IGBTs.

Two of such circuit arrangements, in which the power semiconductor switches of the two circuit arrangements are connected in an antiparallel manner, form subcircuit arrangements of a bidirectional circuit arrangement according to the disclosure, in which a current flow is possible through either the one or the other of the unidirectional power semiconductor switches, i.e. in both directions. In this case, the two control devices of the subcircuit arrangements are preferably configured in such a way that the switching elements of the subcircuit arrangements are opened and closed complementary to one another.

An antiparallel connection of two unidirectional power semiconductor switches, for example two Reverse Blocking IGBTs, is used, for example, as a bidirectional switch in the neutral branch of a BSNPC bridge circuit of an inverter. Accordingly, an inverter according to the disclosure with a BSNPC bridge circuit comprises a bidirectional circuit arrangement according to the disclosure.

BRIEF DESCRIPTION OF THE DRAWINGS

The disclosure is explained in more detail below with the help of figures. The figures serve here to illustrate embodiments of the disclosure, but do not limit the disclosure to the features shown.

DETAILED DESCRIPTION

Figure 1:
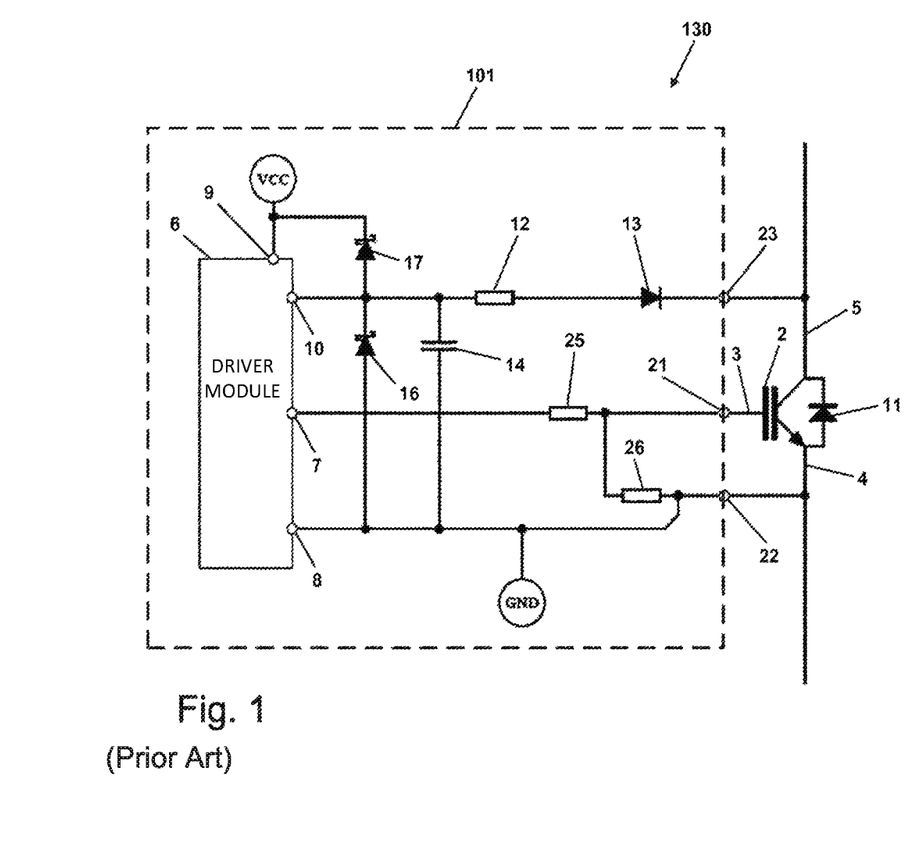
FIG. 1 shows a driver circuit and a circuit arrangement according to the prior art.

FIG. 1 shows a driver circuit 101 according to the prior art for a power semiconductor switch 2. The driver circuit 101 is connected in a circuit arrangement 130 via a first terminal 21 to a control terminal 3 of the power semiconductor switch 2, via a second terminal 22 to a reference potential terminal 4 of the power semiconductor switch 2, and via a third terminal 23 to a controlled terminal 5 of the power semiconductor switch 2. The driver circuit 101 here comprises a driver module 6 with a reference potential input 8 for applying a reference potential GND and a control potential input 9 for applying a control potential VCC. The driver module 6 is configured to apply either the reference potential GND or the control potential VCC to a control output 7 in the case of a control by, for example, a digital circuit, such as a microprocessor, not shown in detail here. The control output 7 is connected via a delay resistor 25 and the first terminal 21 to the control terminal 3 of the power semiconductor switch 2, and the reference potential input 8 is connected via the second terminal 22 to the reference potential terminal 4 of the power semiconductor switch 2 so that in case the control potential VCC is applied to the control output 7, a voltage is applied between the control terminal 3 and the reference potential terminal 4, whereby the power semiconductor switch 2 is activated and thus closed so that a current can flow from the controlled terminal 5 to the reference potential terminal 4, whereas in the case when the reference potential GND is applied to the control output 7, there is no voltage between the control terminal 3 and the reference potential terminal 4, so that the power semiconductor switch 2 is deactivated and thus open so that no current can flow from the controlled terminal 5 to the reference potential terminal 4. Via the delay resistor 25 in conjunction with an intrinsic capacitance between the control terminal 3 and the reference potential terminal 4, a delay time can be set for switching the power semiconductor switch 2 on and off. In addition, a pull-down resistor 26 is provided in the driver circuit 101 between the control terminal 3 and the reference potential terminal 4 in order to pull the potential at the control terminal 3 to the reference potential GND during the start-up of the driver module 6.

The driver module 6 also comprises an overvoltage monitoring input 10, which is connected to the controlled terminal 5 of the power semiconductor switch 2 via an optional first resistor 12, a first diode 13, and the third terminal 23. A voltage against the reference potential GND is applied at the overvoltage voltage monitoring input 10 by the driver module 6 through, for example, a current source integrated in the driver module 6. As long as the voltage between the controlled terminal 5 and the reference potential terminal 4 of the power semiconductor switch 2 does not reach dangerously high values, the voltage present at the overvoltage monitoring input 10 against the reference voltage potential GND is pulled to zero via the first diode 13. If, on the other hand, the voltage between the controlled terminal 5 and the reference potential terminal 4 becomes too large, the voltage present at the monitoring input 10 against the reference potential GND is no longer small, but is the open circuit voltage of the internal current source of the driver module 6. This is detected, for example, by comparison with a threshold value using a comparator within the driver module 6, whereupon the reference potential GND is applied to the control output 7 then, in order to switch off the power semiconductor 2 and thus to protect it from destruction. The described functionality of the driver module 7 for using the overvoltage monitoring input 10 is implemented in this form in many driver modules and is known to a person skilled in the art, thus it is not explicitly illustrated again in the driver module 6 in FIG. 1. Alternatively, other driver modules may be arranged for providing the voltage at the overvoltage monitoring input 10 against the reference potential GND by a separate external current source.

The voltage at the overvoltage monitoring input 10 is clamped to zero only when the power semiconductor switch 2 is certainly switched on. In order to prevent that transient events during the turn-on of the power semiconductor switch 2 cause an erroneous turn-off of the power semiconductor switch 2 by the above-described overvoltage monitoring function of the driver module 6, the overvoltage monitoring function must be activated in a delayed manner. For this purpose, a capacitance 14 is provided between the overvoltage monitoring input 10 and the reference potential input 8 in the driver circuit 101. During the time when the reference potential GND is present at the control output 7, i.e., while the power semiconductor switch 2 is switched off, the reference potential GND is also applied to the overvoltage monitoring input 10 by the driver module, whereby the capacitance 14 is discharged. When the control potential VCC is applied to the control output 7 then, i.e., when the power semiconductor switch 2 is switched on, at first the capacitance 14 is charged, as a result of which the voltage at the overvoltage monitoring input 10 against the reference potential GND is applied in a correspondingly delayed manner.

In the driver circuit 101 of FIG. 1, a second diode 16 is arranged between the reference potential input 8 and the overvoltage monitoring input 10, and a third diode 17 is arranged between the overvoltage monitoring input 10 and the control potential input 9. These diodes are optional and serve as protective circuitry for the overvoltage monitoring input 10.

The power semiconductor switch 2 in the circuit arrangement 130 according to FIG. 1 is in this case, for example, an IGBT (insulated gate bipolar transistor) with an antiparallel fourth diode 11. As a result, not only a unidirectional flow direction from the controlled terminal 5 to the reference potential terminal 4 is provided for the power semiconductor switch 2 of FIG. 1, but also a current flow in the opposite direction via the antiparallel fourth diode 11 is possible when the potential at the reference potential terminal 4 of the power semiconductor switch 2 is higher than the potential at its controlled terminal 5.

Figure 2:
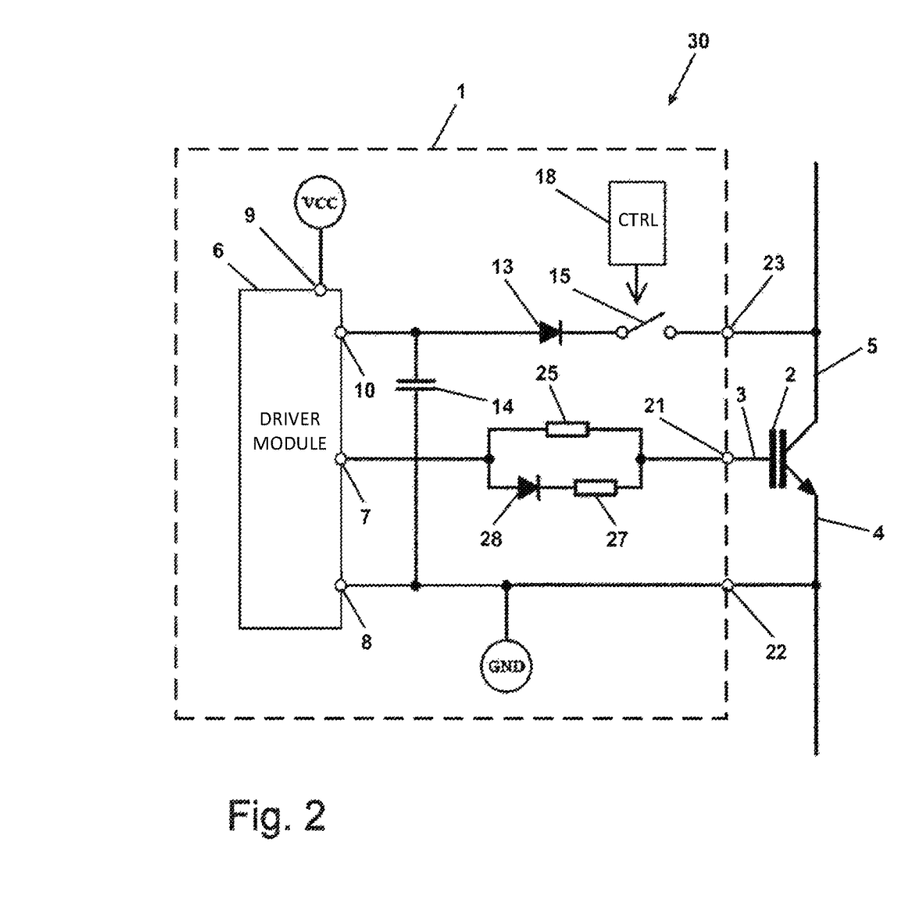
FIG. 2 shows a driver circuit according to the disclosure in a circuit arrangement according to the disclosure.

FIG. 2 shows a driver circuit 1 according to the disclosure in a circuit arrangement 30 according to the disclosure. In the circuit arrangement 30 of FIG. 2, a power semiconductor switch 2 with a unidirectional flow direction, in this case an IGBT without an antiparallel diode, is connected to the terminals 21, 22 and 23 of the driver circuit 1. In the illustrated driver circuit 1 according to the disclosure, an actively controllable switching element 15 is arranged between the first diode 13 and the third terminal 23. With this actively controllable switching element 15, an undesired current flow in a connection path from the second terminal 22 via the capacitor 14 and the first diode 13, which can occur due to the unidirectional flow direction of the power semiconductor switch 2 when the potential at the reference potential terminal 4 is higher than the potential at the controlled terminal 5, may be interrupted selectively. The actively controllable switching element 15 can also be arranged at any other point in the connection path, for example between the capacitance 14 and the first diode 13 or between the second terminal 22 and the capacitance 14.

A control device 18 is provided for controlling the switching element 15. In this case, the control device 18 can be configured such that the switching element 15 is closed when the control potential VCC is applied to the control output 7. However, the control device 18 can also be configured in such a way that the switching element 15 is opened when the reference potential GND is present at the control output 7. Undesired currents in the connection path, which can be switched by the switching element 15, occur only when the potential at the reference potential terminal 4 of the power semiconductor switch 2 is higher than the potential at its controlled terminal 5. Therefore, in a further embodiment, the control device 18 can also be configured such that the switching element 15 is opened when the potential at the second terminal 22 is higher than the potential at the third terminal 23. Of course, combinations of the mentioned conditions for opening and closing the actively controllable switching element 15 by the control device 18 are also possible.

In the driver circuit of FIG. 2, the control output 7 is connected to the first terminal 21 via a parallel connection of the delay resistor 25 and a series connection of a fifth diode 28 with a further delay resistor 27. In this arrangement, a current flows through the parallel circuit of the delay resistor 25 and the other delay resistor 27 when the power semiconductor switch 2 is turned on, while during the switch-off a current flows through the delay resistor 25 only. This way different delay times for the switching on and off can be set.

Further, in one embodiment, in the driver circuit 1 of FIG. 2 as compared to the driver circuit of FIG. 1, the optional second diode 16 and third diode 17, as well as the optional pull-down resistor 26 and the optional first resistor 12, are dispensed with.

Figure 3:
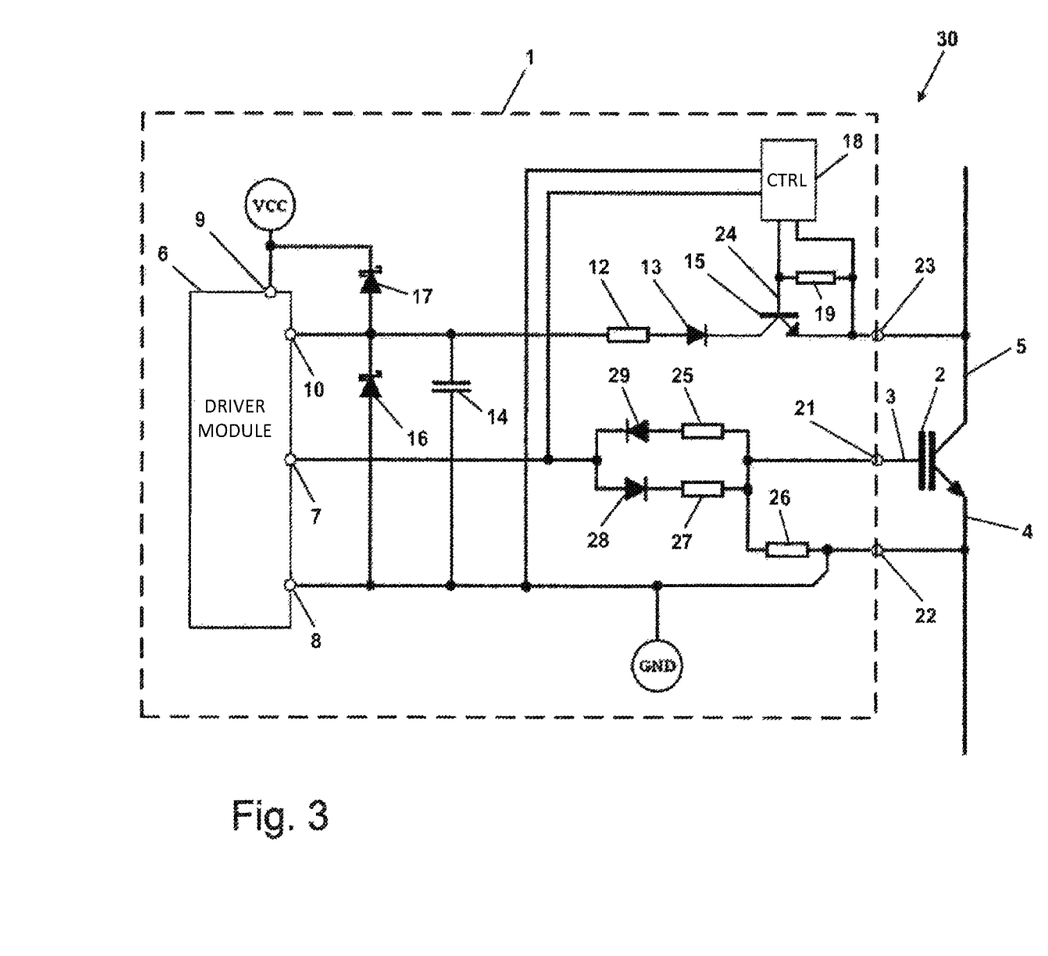
FIG. 3 shows a further embodiment of a circuit arrangement according to the disclosure.

In the embodiment of the circuit arrangement 30 according to the disclosure as per FIG. 3, the actively controllable switching element 15 is a semiconductor switch being arranged between the first diode 13 and the third terminal 23 and comprising a control input 24. The second resistor 19 serves for a safe and rapid switching off of the semiconductor switch upon its deactivation. The control device 18 is connected to the control output 7 and to the reference potential input 8 and can thereby evaluate the potential at the control output 7 in order to open or close the switching element 15 as a function thereof. In this embodiment, the control device 18 also fulfills the function of a galvanic separation between the control output 7 or the reference potential input 8, respectively, and the controlled terminal 5, which is also connected to the control device 18 via the third terminal 23 of the driver circuit 1, and at which, as the case may be, a high voltage against the reference potential GND is present with the power semiconductor switch 2 being switched off. In the embodiment of FIG. 3, the semiconductor switch is an NPN transistor. It is quite as well possible to use a PNP transistor or another transistor as a switch here.

In the driver circuit of FIG. 3, in the connection between the control output 7 and the first terminal 21, a parallel connection of a series connection of a sixth diode 29 with the delay resistor 25 and a series connection of the fifth diode 28 with the further delay resistor 27 is provided, wherein the diodes 28 and 29 have opposite flow directions. In this arrangement, a current flows through the delay resistor 25 when the power semiconductor switch 2 is turned off, and through the further delay resistor 27 upon turn-on. This way different delay times for the switching on and off can be set.

Figure 4:
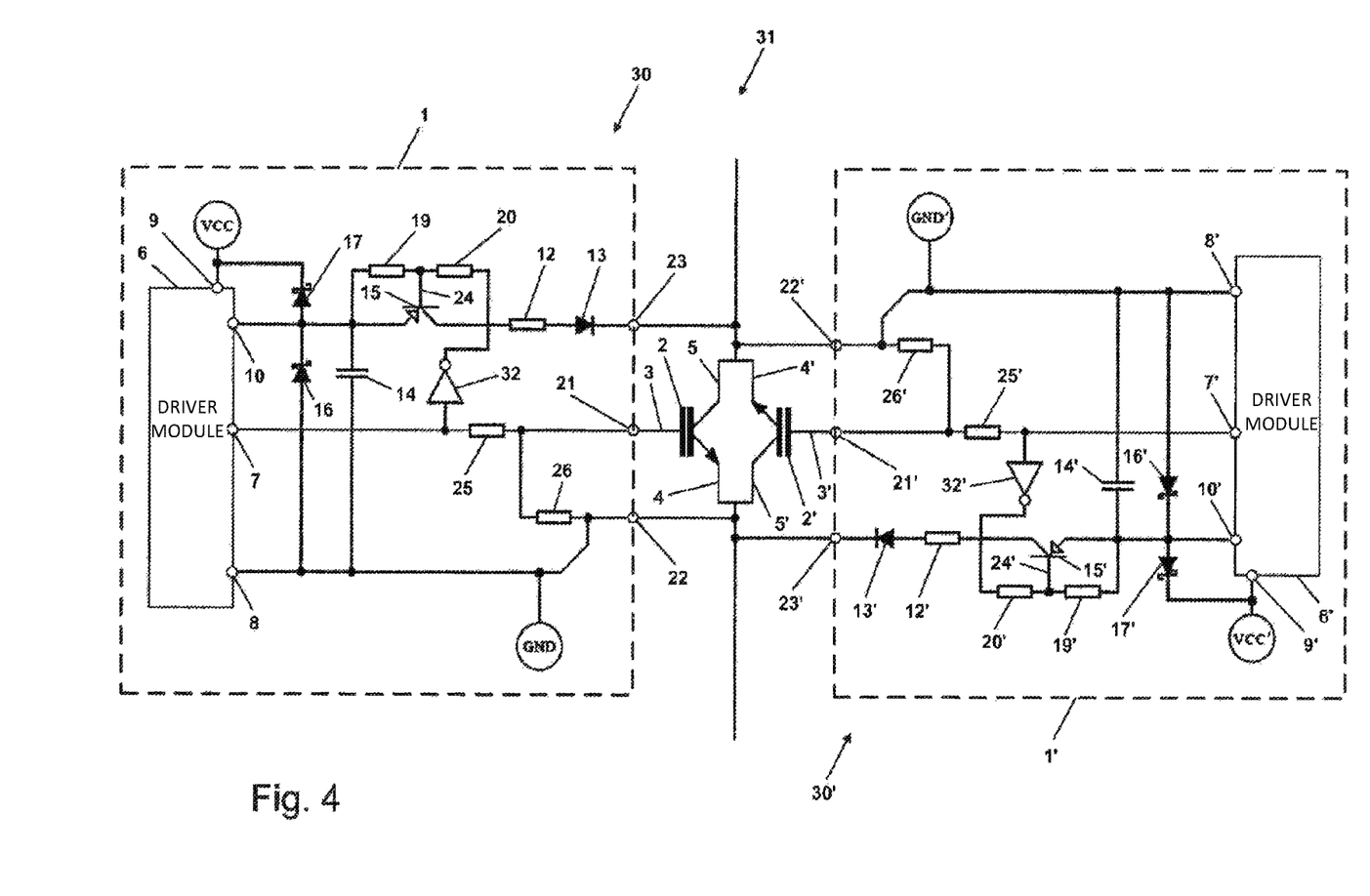
FIG. 4 shows a bidirectional circuit arrangement according to the disclosure.

In the case of the driver circuit 1 in FIG. 4, the actively controllable switching element 15 is likewise provided as a semiconductor switch with a control input 24 and is arranged here between the capacitance 14 and the first resistor 12. On account of this arrangement and the use of a PNP transistor, no control device 18 with galvanic separation is required as in the example embodiment in FIG. 3. The control input 24 is functionally connected directly to the control output 7 of the driver module 6 via an inverter 32, so that the switching element 15 is closed when the control potential VCC is present at the control output 7 and is opened when the reference potential GND is present at the control output 7. The second resistor 19 again serves for the safe and rapid turn-off of the semiconductor switch during its deactivation, and the third resistor 20 serves here for setting the control current of the semiconductor switch.

Furthermore, FIG. 4 in particular also shows a bidirectional circuit arrangement 31 according to the disclosure comprising two subcircuit arrangements, each of which is formed by a circuit arrangement 30, 30' according to the disclosure. The power semiconductor switches 2, 2' of the two subcircuit arrangements are connected anti-parallel, i.e. the unidirectional flow directions of the two power semiconductor switches 2, 2' are opposite to one another, and thus make it possible, in the case of complementary control, to let a current flow pass through either in one direction or the other, or to block the current in both directions in case the two power semiconductor switches 2, 2' are switched off. Accordingly, it is also advantageous if the control devices 18, 18' of the respective driver circuits 1, 1' in the subcircuit arrangements are arranged in such a way that switching elements 15, 15' of the subcircuit arrangements are opened and closed complementary to one another.

An antiparallel connection of two power semiconductor switches with unidirectional flow direction for the realization of a bidirectional switch is used, for example, in the neutral branch of a BSNPC bridge circuit in three-level inverters. Accordingly, this also results in an advantageous use of the bidirectional circuit arrangement 31 according to the disclosure for a BSNPC bridge circuit.

A bidirectional circuit arrangement 31 according to the disclosure is not limited to the embodiment of the subcircuit arrangements shown in FIG. 4. The subcircuit arrangements can also be implemented by circuit arrangements 30 as shown in FIG. 2 or FIG. 3, as well as by any other form of a circuit arrangement according to the disclosure.

The disclosure is also not restricted to the explicitly shown embodiments, but can be modified in many ways, in particular combined with other embodiments shown or known to a person skilled in the art.

The invention claimed is:

1. A driver circuit for a power semiconductor switch with a unidirectional flow direction comprising a control terminal, a reference potential terminal and a controlled terminal, the driver circuit comprising:
   a driver module with a control output, a reference potential input, and an overvoltage monitoring input,
   wherein the control output is connected to a first terminal provided for connection to the control terminal,
   wherein the reference potential input is connected to a second terminal provided for connection to the reference potential terminal,
   wherein the overvoltage monitoring input is connected via a first diode to a third terminal provided for connection to the controlled terminal, and
   wherein the overvoltage monitoring input is connected to the reference potential input via a capacitance, and
   an actively controllable switching element in a connection path from the second terminal to the third terminal via the capacitance and the first diode,
   wherein an anode of the first diode is connected to the overvoltage monitoring input and a cathode of the first diode is connected to the third terminal, wherein an orientation of the first diode prevents a non-breakdown current from conducting from the third terminal to the overvoltage monitoring input.

2. The driver circuit according to claim 1, wherein the driver module is configured to selectively apply at the control output either a reference potential applied at the reference potential input or a control potential applied at a control potential input of the driver module.

3. The driver circuit according to claim 1, wherein the driver module is configured to detect an exceedance of a threshold value set within the driver module by a voltage at the overvoltage monitoring input against the reference potential.

4. The driver circuit according to claim 1, wherein the overvoltage monitoring input is connected to the third terminal via a series circuit comprising a first resistor and the first diode.

5. The driver circuit according to claim 1, further comprising:
   a second diode arranged between the reference potential input and the overvoltage monitoring input; and
   a third diode arranged between the overvoltage monitoring input and the control potential input.

6. The driver circuit according to claim 1, further comprising a control device configured to open the switching element when a potential at the second terminal is higher than the potential at the third terminal.

7. The driver circuit according to claim 1, further comprising a control device configured to maintain the switching element in a closed state when the control potential is present at the control output.

8. The driver circuit according to claim 1, further comprising a control device configured to maintain the switching element in an open state when the reference potential is present at the control output.

9. The driver circuit according to claim 1, wherein the switching element is arranged in a portion of the connection path between the capacitance and the third terminal.

10. The driver circuit according to claim 1, wherein the switching element is arranged in a portion of the connection path between the second terminal and the capacitance.

11. The driver circuit according to claim 1, wherein the switching element is a semiconductor switch comprising a control input that selectively controls a current conduction path that extends between the second terminal and the third terminal, and wherein the first diode and the capacitance reside in series with the current conduction path of the semiconductor switch.

12. The driver circuit according to claim 11, wherein the control input is connected to the control output of the driver module.

13. A circuit arrangement comprising a driver circuit, the driver circuit comprising:
   a driver module with a control output, a reference potential input, and an overvoltage monitoring input,
   wherein the control output is connected to a first terminal provided for connection to a control terminal,
   wherein the reference potential input is connected to a second terminal provided for connection to a reference potential terminal,
   wherein the overvoltage monitoring input is connected via a first diode to a third terminal provided for connection to a controlled terminal, wherein an anode of the first diode is connected to the overvoltage monitoring input and a cathode of the first diode is connected to the third terminal, wherein an orientation of the first diode prevents a non-breakdown current from conducting from the third terminal to the overvoltage monitoring input, and
   wherein the overvoltage monitoring input is connected to the reference potential input via a capacitance, and an actively controllable switching element in a connection path from the second terminal to the third terminal via the capacitance and the first diode; and a power semiconductor switch with unidirectional flow direction, comprising the control terminal, the reference potential terminal and the controlled terminal, wherein the first terminal is connected to the control terminal, the second terminal is connected to the reference potential terminal and the third terminal is connected to the controlled terminal of the power semiconductor switch.

14. The circuit arrangement according to claim 13, wherein the power semiconductor switch is an IGBT without an antiparallel diode.

15. A bidirectional circuit arrangement comprising two subcircuit arrangements each formed by the circuit arrangement according to claim 13, wherein the power semiconductor switches of the two subcircuit arrangements are connected in an antiparallel manner.

16. The bidirectional circuit arrangement according to claim 15, each of the two subcircuit arrangements further comprising a control device configured to open the switching element when the potential at the second terminal is higher than the potential at the third terminal, wherein the two control devices of the subcircuit arrangements are arranged such that the switching elements of the subcircuit arrangements are opened and closed complementarily to one another.

17. The bidirectional circuit arrangement according to claim 15, each of the two subcircuit arrangements further comprising a control device configured to close the switching element when the control potential is present at the control output, wherein the two control devices of the subcircuit arrangements are arranged such that the switching elements of the subcircuit arrangements are opened and closed complementarily to one another.

18. The bidirectional circuit arrangement according to claim 15, each of the two subcircuit arrangements further comprising a control device configured to open the switching element when the reference potential is present at the control output, wherein the two control devices of the subcircuit arrangements are arranged such that the switching elements of the subcircuit arrangements are opened and closed complementarily to one another.

* * * * *